(12) United States Patent
Sugio (10) Patent No.: US 7,196,937 B2
(45) Date of Patent: Mar. 27, 2007

(54) SEMICONDUCTOR INTEGRATED CIRCUIT WITH FLASH INTERFACE

(75) Inventor: Kenichiro Sugio, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/228,310

(22) Filed: Sep. 19, 2005

(65) Prior Publication Data

US 2006/0077721 A1    Apr. 13, 2006

(30) Foreign Application Priority Data

Oct. 8, 2004    (JP) ............................. 2004-295996

(51) Int. Cl.
*G11C 16/04* (2006.01)

(52) U.S. Cl. ............................ 365/185.33; 365/185.11; 365/189.07

(58) Field of Classification Search ............ 365/185.33, 365/185.11, 189.07
See application file for complete search history.

(56) References Cited

U.S. PATENT DOCUMENTS 6,711,059 B2 *    3/2004    Sinclair et al. ........ 365/185.33

FOREIGN PATENT DOCUMENTS

| JP | 08-063446 | 3/1996 |
|---|---|---|
| JP | 11-175311 | 7/1999 |

* cited by examiner

*Primary Examiner*—Huan Hoang
(74) *Attorney, Agent, or Firm*—Nixon Peabody LLP; Donald R. Studebaker (57) ABSTRACT

A semiconductor integrated circuit has a flash interface for receiving command codes and controlling a flash memory to perform corresponding read, write, and erase operations. The flash interface generates a status signal indicating whether the flash memory is currently being controlled or not. The flash interface includes an address circuit for input and output of flash memory addresses, a status circuit that generates the status signal, and a resetting circuit that resets the status signal to the non-control state according to an address output from the address circuit. This hardware feature is used to halt write operations at the maximum address without the need for a halting command, and to prevent consecutive erasing of the same part of the flash memory.

18 Claims, 9 Drawing Sheets

|     | MSB |     |     |     |     |     |     | LSB |
|-----|-----|-----|-----|-----|-----|-----|-----|-----|
| $A_T$ | — | — | — | — | — | $A_{17}$ | $A_{16}$ | $A_{15}$ |
| $A_M$ | $A_{14}$ | $A_{13}$ | $A_{12}$ | $A_{11}$ | $A_{10}$ | $A_9$ | $A_8$ | $A_7$ |
| $A_B$ | $A_6$ | $A_5$ | $A_4$ | $A_3$ | $A_2$ | $A_1$ | $A_0$ | $A_{-1}$ |

SEMICONDUCTOR INTEGRATED CIRCUIT WITH FLASH INTERFACE

BACKGROUND OF THE INVENTION

1. Field of the Invention

The present invention relates to a flash memory interface circuit useful in a semiconductor integrated circuit in, for example, a multi-chip package.

2. Description of the Related Art

Figure 1:
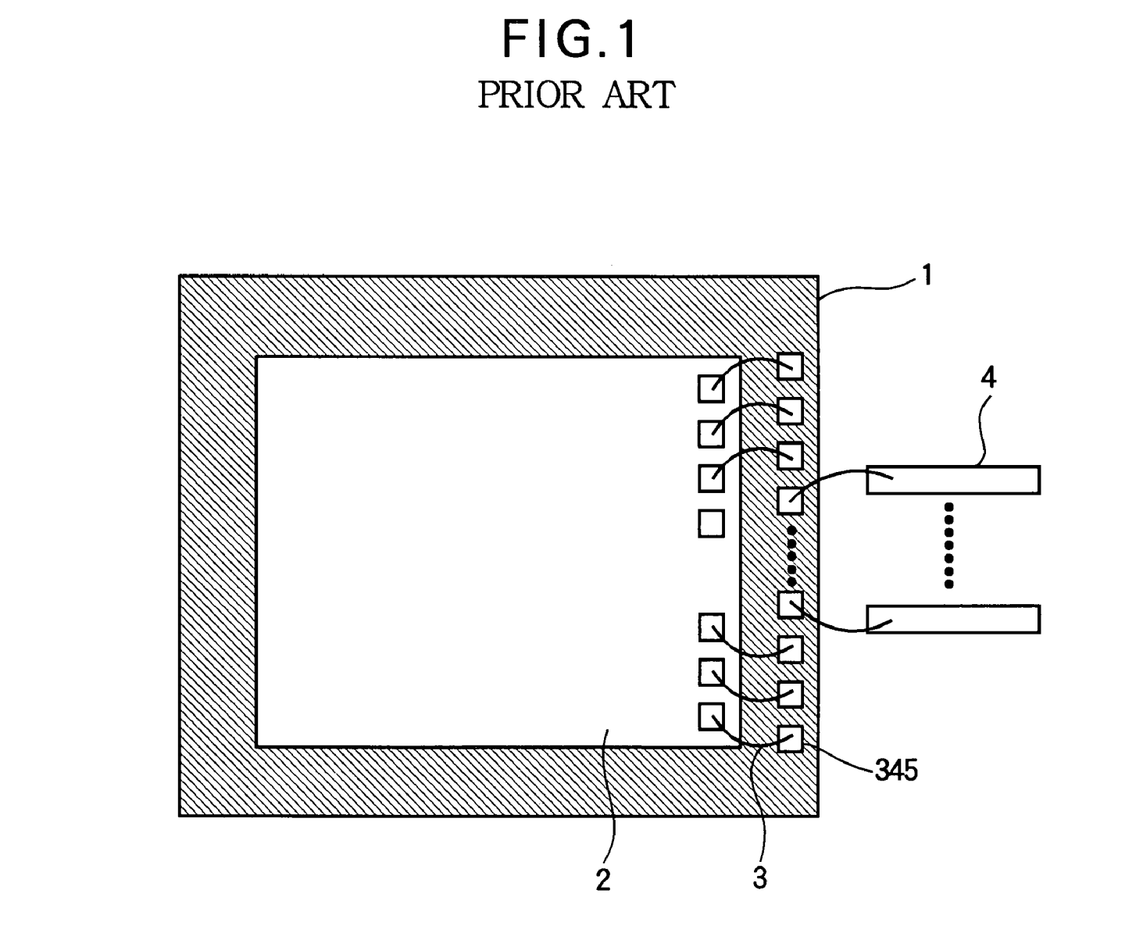
FIG. 1 illustrates connections in a multi-chip package.

It is known art to enclose two (or more) semiconductor integrated circuits or chips in a single package to form a multi-chip package or MCP. One of the two chips is typically a flash memory. The other chip may be a semiconductor integrated circuit that controls access to the flash memory. The two chips are interconnected by internal lead wires, and the controlling chip is connectable to devices external to the package through external leads. FIG. 1 schematically illustrates the controlling chip 1, flash memory chip 2, internal lead wires 3, external leads 4, and pads 345 to which the lead wires are bonded.

The controlling chip includes an interface circuit, referred to as a flash interface, that receives control signals and data from a central processing unit (CPU) through a CPU interface. The received data may convey command information, address information, and information (referred to as write data) to be written in the flash memory chip. The flash interface converts the command information to signals that read, write, or erase data in the flash memory chip. In a read or write operation, the flash interface also generates further flash memory addresses by successively incrementing a starting address received through the CPU interface.

It is not unusual for the central processing unit to continue writing data in the flash memory chip, without erasing any data, until the flash memory cell array is full. The data are stored at successively higher addresses until the maximum address is reached, at which point the write operation must stop. In a conventional flash interface, which unconditionally executes the commands it receives from the central processing unit, this requires the transfer of a stopping command through the CPU interface. To reduce the load on the interface, it would be helpful if this command could be eliminated.

A flash memory chip is typically organized into individually erasable sectors and blocks. It is necessary to keep track of the sectors and blocks that have been erased, so that the same sector or block will not be erased twice consecutively. Aside from wasting time, consecutive erasing can damage or degrade memory cells and lead to data errors. A conventional flash interface, which faithfully executes all CPU commands, cannot prevent this type of damage; it is necessary to rely on the integrity of the central processing unit and its software. CPU software, however, is not always completely reliable.

SUMMARY OF THE INVENTION

An object of the present invention is to reduce the number of commands sent to a flash interface during a write operation that fills a flash memory cell array.

Another object is to enable a flash interface to prevent consecutive erasing of the same area in a flash memory.

The invention provides a semiconductor integrated circuit with a flash interface for controlling a flash memory to perform read, write, and erase operations. The flash interface generates a status signal having a first state indicating that the flash interface is currently controlling the flash memory and a second state indicating that the flash interface is not currently controlling the flash memory. The flash interface includes an address circuit for input and output of flash memory addresses, a status circuit that generates the status signal, and a resetting circuit that resets the status signal to the second state responsive to an address output from the address circuit, thereby halting control of the flash memory by the flash interface.

According to one aspect of the invention, the address circuit includes a counter that generates a consecutive series of flash memory addresses. The resetting circuit includes a first circuit that detects output of a maximum address from the counter during a write operation and halts the output of further consecutive addresses by stopping the counting operation, and a second circuit that resets the status signal after write access to the maximum address is completed.

In this aspect, the invention reduces the number of commands that have to be sent to the flash interface by providing hardware that automatically terminates a write operation at the maximum address in the flash memory.

According to another aspect of the invention, the flash memory has a memory cell array divided into a plurality of parts such as blocks and sectors. The erase operations include erasing of a selectable one of these parts. The resetting circuit includes a consecutive erasing prevention circuit that resets the status signal to the second state when the flash interface circuit attempts to erase the same part of the memory cell array twice consecutively.

In this aspect, the invention prevents consecutive erasing of the same part of a flash memory.

DETAILED DESCRIPTION OF THE INVENTION

Embodiments of the invention will now be described with reference to the attached drawings, in which like elements are indicated by like reference characters.

These embodiments can be implemented by adding circuitry described below to, for example, the conventional flash interface 5 illustrated in FIG. 1, which communicates through a CPU interface (I/F) 6 with a central processing unit (not shown) and through a plurality of wire bonding pads 7 with a four-megabit (4 Mb) flash memory 8. At least the flash interface 5 and the CPU interface 6 are disposed in the controlling chip 1 shown in FIG. 1, while the flash memory 8 is disposed in the flash memory chip 2.

Figure 2:
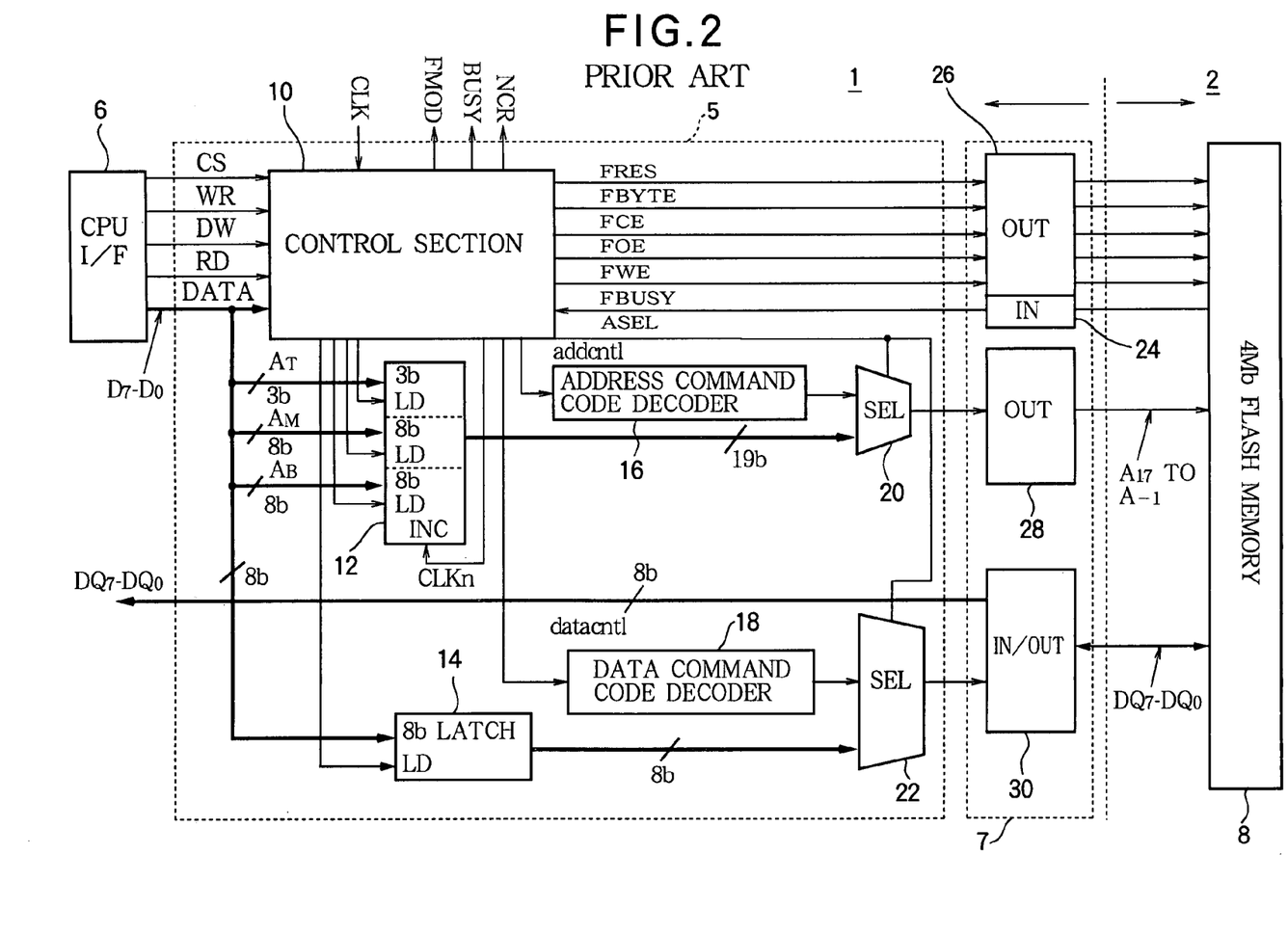
FIG. 2 is a block diagram of a conventional flash interface.

The flash interface 5 includes a control section 10, a presettable address counter 12, a write data latch 14, an address command code decoder 16, a data command code decoder 18, and a pair of selectors (SEL) 20, 22. The wire bonding pads 7 include an input pad 24 for input of a status signal from the flash memory 8, a set of output pads 26 for output of control signals to the flash memory 8, another set of output pads 28 for output of address signals to the flash memory 8, and a set of input/output pads 30 for transfer of data to and from the flash memory 8.

The control section 10 receives a chip select signal (CS), a command write signal (WR), a data write signal (DW), a read signal (RD), and an eight-bit (8b) parallel data signal ($D_7$–$D_0$) from the CPU interface 6, receives a flash busy signal (FBUSY) from the flash memory 8 through input pad 24, receives an externally generated clock signal (CLK), and sends a flash reset signal (FRES), a byte or word access selection signal (FBYTE), a flash chip enable signal (FCE), a flash output enable signal (FOE), and a flash write enable signal (FWE) to the flash memory 8 through output pads 26. The control section 10 also outputs a flash mode signal (FMOD), a busy signal (BUSY), and an interface command received signal (NCR). Except for the data signals ($D_7$–$D_0$), all of these signals are active low. In the embodiments that follow, FBYTE is held low, designating the byte access mode. In addition, the control section 10 sends an incrementing clock signal (CLKn) to the increment input terminal (INC) of the presettable address counter 12, load signals (LD) to the presettable address counter 12 and write data latch 14, a control signal (addcntl) to the address command code decoder 16, a control signal (datacntl) to the data command code decoder 18, and an address selection signal (ASEL) to the selectors 20, 22. The presettable address counter 12 and write data latch 14 also receive the eight-bit parallel data signal ($D_7$–$D_0$)

Figure 3:
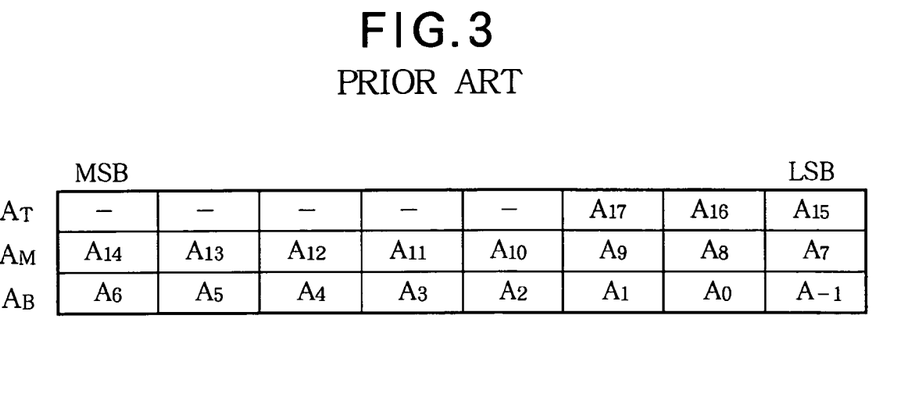
FIG. 3 illustrates the address structure of a byte-accessible four-megabit flash memory.

The presettable address counter 12 generates a nineteen-bit address signal with the structure shown in FIG. 3, including a three-bit top address $A_T$ (bits $A_{17}$ to $A_{15}$), an eight-bit middle address $A_M$ (bits $A_{14}$ to $A_7$), and an eight-bit bottom address $A_B$ (bits $A_6$ to $A_{-1}$). When the address is received on the eight parallel data signal lines ($D_7$–$D_0$), bits $A_{-1}$, $A_7$, and $A_{15}$ are received on the least significant bit line or LSB line ($D_0$) and bits $A_6$ and $A_{14}$ are received on the most significant bit line or MSB line ($D_7$). As shown in FIG. 2, the presettable address counter 12 has an eight-bit (8b) parallel connection to the data signal lines ($D_7$–$D_0$) for input of the bottom address $A_B$, another eight-bit parallel connection to the data signal lines for input of the middle address $A_M$, a three-bit (3b) parallel connection to the data signal lines for input for the top address $A_T$, and a nineteen-bit parallel output connection to selector 20. The presettable address counter 12 operates while the flash mode signal (FMOD) is high.

The write data latch 14 is an eight-bit latch that latches the eight-bit data on the data signal lines ($D_7$–$D_0$) in synchronization with the load signal (LD) from the control section 10, and outputs the latched data to selector 22.

The address command code decoder 16 decodes the address control signal (addcntl) to generate an address at which command code data may be written in the flash memory 8, and supplies this address to selector 20.

The data command code decoder 18 decodes the data control signal (datacntl) to generate command code data, and supplies the command code data to selector 22.

Selector 20 selects the nineteen-bit address signal from the presettable address counter 12 or the address signal from the address command code decoder 16 according to the address selection signal (ASEL) received from the control section 10, and sends the selected address to the flash memory 8 through output pads 28.

Selector 22 selects the eight-bit data signal from the write data latch 14 or the data signal from the data command code decoder 18 according to the address selection signal (ASEL) and sends the selected data signal to the flash memory 8 through the input/output pads 30.

In read access to the flash memory 8, selector 22 is placed in the high-impedance output state and the flash memory 8 outputs read data ($DQ_7$–$DQ_0$) through the input/output pads 30 to the central processing unit (not shown).

The flash memory 8 has a memory cell array (not shown) organized into eight blocks of thirty-two sectors each. Each sector stores two kilobytes of data; each block stores sixty-four kilobytes.

Figure 4:
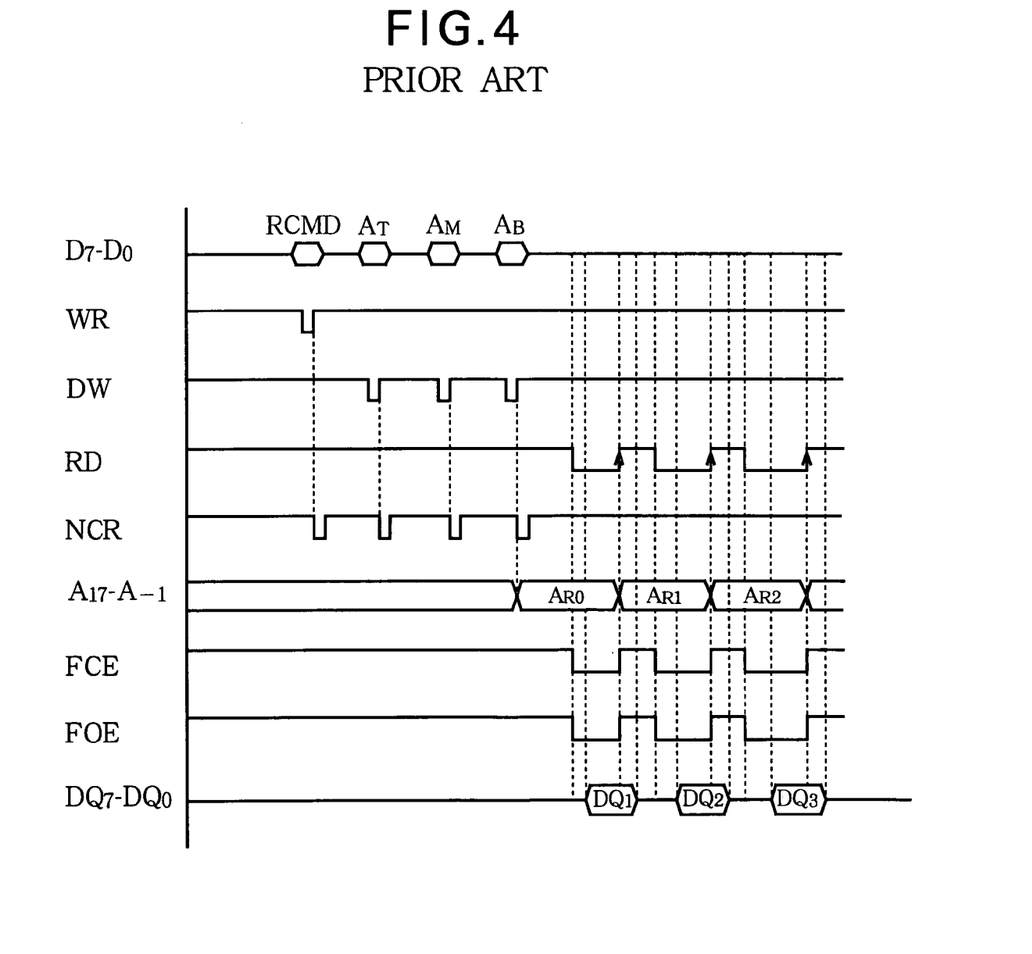
FIG. 4 is a timing waveform diagram illustrating a conventional flash memory read operation.

The read access procedure is illustrated in FIG. 4. The flash interface receives a read command (RCMD) from the CPU interface 6 on the data signal lines ($D_7$–$D_0$), identifies it as a command from an accompanying WR pulse, and acknowledges reception of the command on the NCR signal line. Next, the flash interface receives the starting read address ($A_{R0}$) in three bytes ($A_T$, $A_M$, $A_B$) on the data signal lines ($D_7$–$D_0$) with accompanying pulses on the data write signal line (DW), acknowledges the address, latches it in the presettable address counter 12, and sends the address ($A_{R0}$) to the flash memory 8 through output pads 28, which output the nineteen address bits ($A_{17}$ to $A_{-1}$) in parallel. After these preparations, the flash interface receives a series of pulses on the read signal line (RD), in response to each of which it activates the flash chip enable (FCE) and flash output enable (FOE) signals. These signals cause the flash memory 8 to output data read from the designated address on the flash data signal lines ($DQ_7$–$DQ_0$). At each active-to-inactive (low-to-high) transition of the read signal (RD), the control section 10 in the flash interface outputs an incrementing clock signal to the presettable address counter 12, causing the presettable address counter 12 to increment the address, so that data are read from an increasing series of consecutive addresses $A_{R0}$, $A_{R1}$, $A_{R2}$, . . . .

Figure 5:
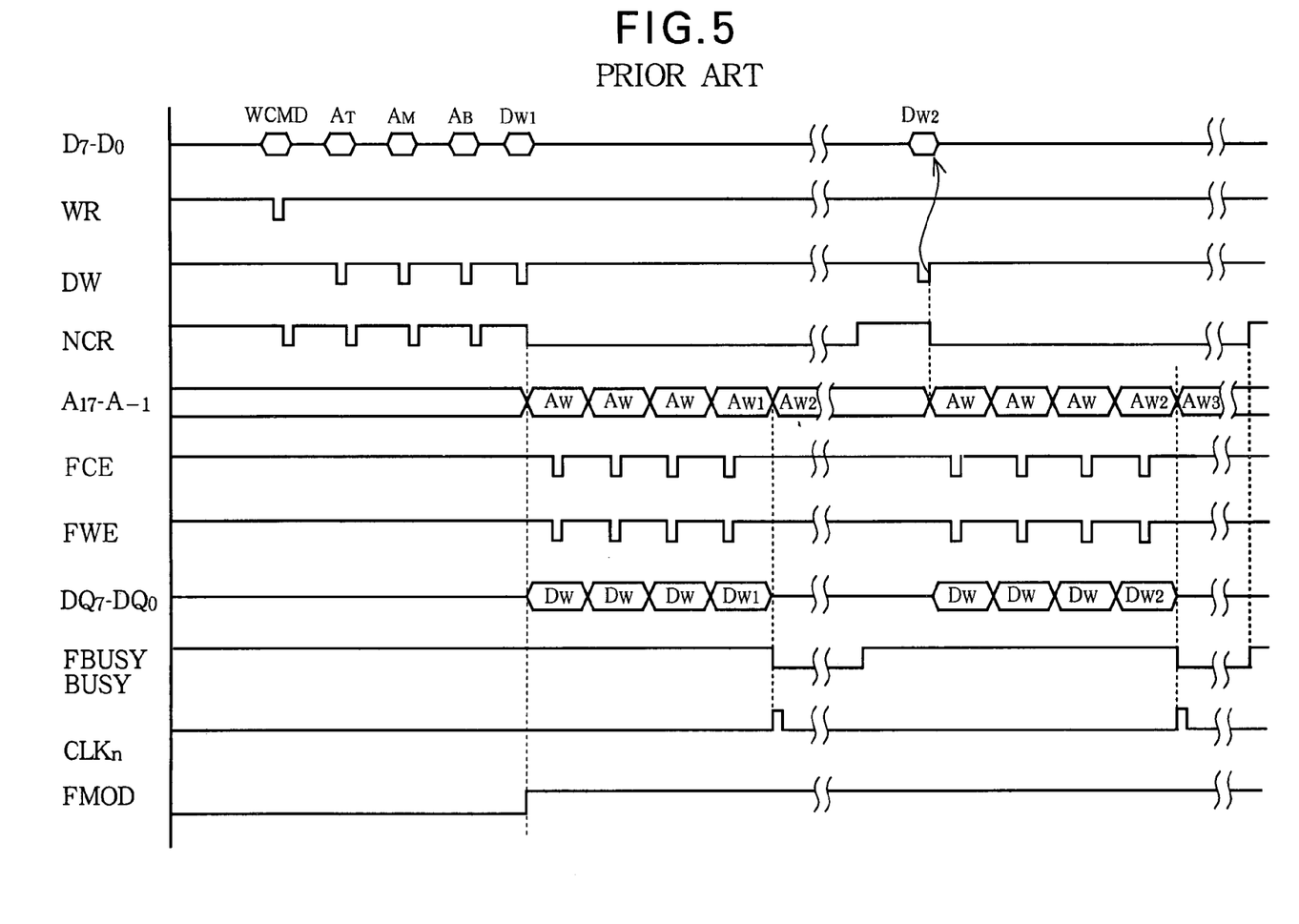
FIG. 5 is a timing waveform diagram illustrating a conventional flash memory write operation.

The write access sequence is illustrated in FIG. 5. The flash interface receives a write command (WCMD), the first write address ($A_T$, $A_M$, $A_B$), and the first byte of write data ($D_{W1}$) on the data signal lines ($D_7$–$D_0$) from the CPU interface 6 and acknowledges this information on the NCR signal line. The control section 10 has the selectors 20, 22 select the outputs from the address command code decoder 16 and data command code decoder 18 and writes three bytes of command data ($D_W$) at designated addresses ($A_W$) in the flash memory 8 in synchronization with flash chip enable (FCE) and flash write enable (FWE) pulses, then has the selectors 20, 22 select output from the presettable address counter 12 and write data latch 14 and sends the first write address ($A_{W1}$) and first write data ($D_{W1}$) to the flash memory 8. The flash memory 8 commences the comparatively time-consuming process of programming or writing the data ($D_{W1}$) at the designated address ($A_{W1}$), during which process the flash busy signal (FBUSY) output from the flash memory and the corresponding busy signal (BUSY) output from the control section 10 are held at the active level (low). An incrementing clock (CLKn) pulse is sent to the presettable address counter 12 when the busy signals go low, causing the presettable address counter 12 to increment to the next address ($A_{W2}$). When the programming operation is completed, the flash memory 8 inactivates the FBUSY signal, the control section 10 inactivates the BUSY and NCR signals, and the central processing unit responds by sending the next byte of write data ($D_{W2}$), which is programmed into the flash memory 8 in the same way as the first byte of write data: the selectors 20, 22 output command code data and addresses on the data lines ($DQ_7$ to $DQ_0$) and address signal lines ($A_{17}$ to $A_{-1}$), followed by the second write address ($A_{W2}$) and write data ($D_{W2}$).

This operation continues as long as the central processing unit continues to supply more write data, the presettable address counter 12 continuing to generate consecutively increasing addresses. The flash mode signal (FMOD) remains low while the flash interface receives the initial write command, starting address, and first write data, then goes high and remains high for the duration of the write operation, including the programming of the first data and the reception and programming of the subsequent write data.

Figure 6:
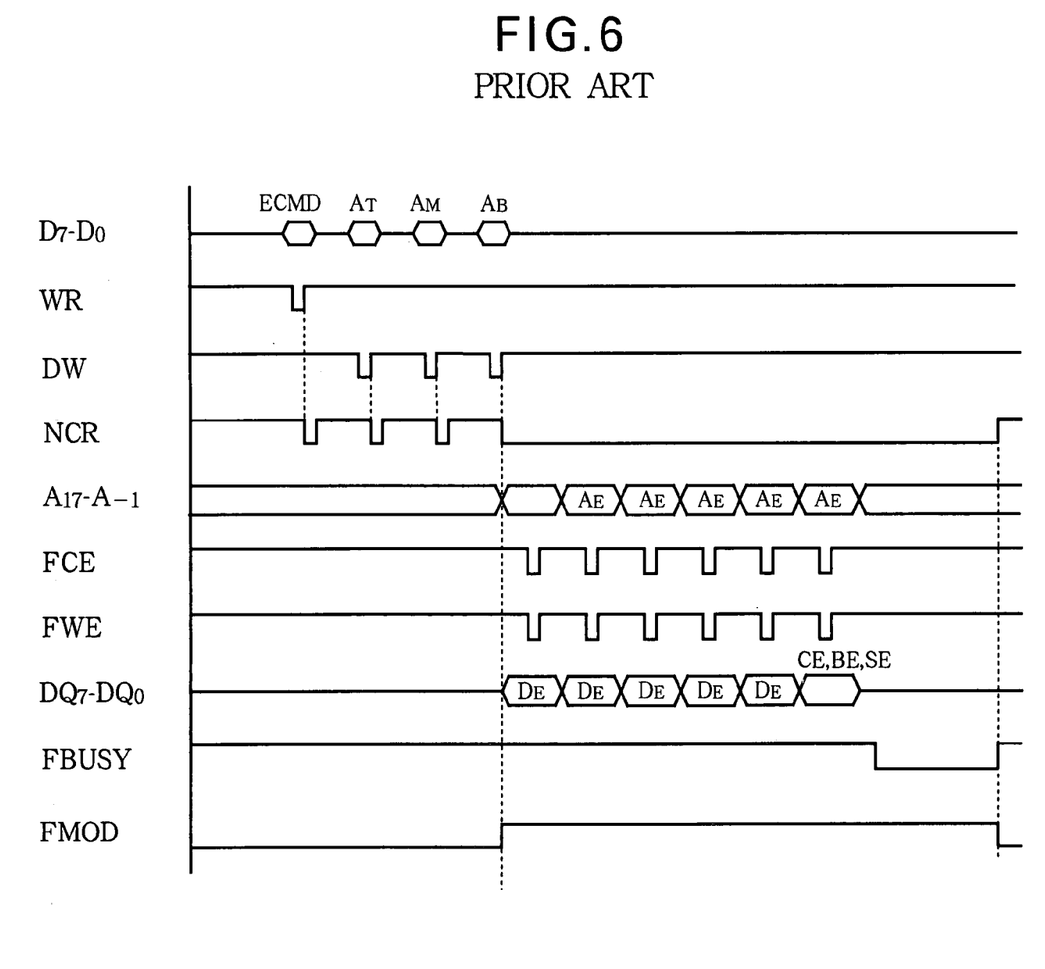
FIG. 6 is a timing waveform diagram illustrating a conventional flash memory erase operation.

The erase procedure, illustrated in FIG. 6, is generally similar to the write procedure. The flash interface receives an erase command (ECMD) and the address ($A_T$, $A_M$, $A_B$) of the block or sector to be erased (the entire flash memory 8 may also be erased). The control section 10 sends the flash memory 8 a five-byte erase command code (DE) on the data lines ($DQ_7$ to $DQ_0$) accompanied by address information ($A_E$) on the address lines ($A_{17}$ to $A_{-1}$) and followed by the erase address ($A_E$) and data indicating a chip erase (CE), block erase (BE), or sector erase (SE) operation.

First Embodiment

Figure 7:
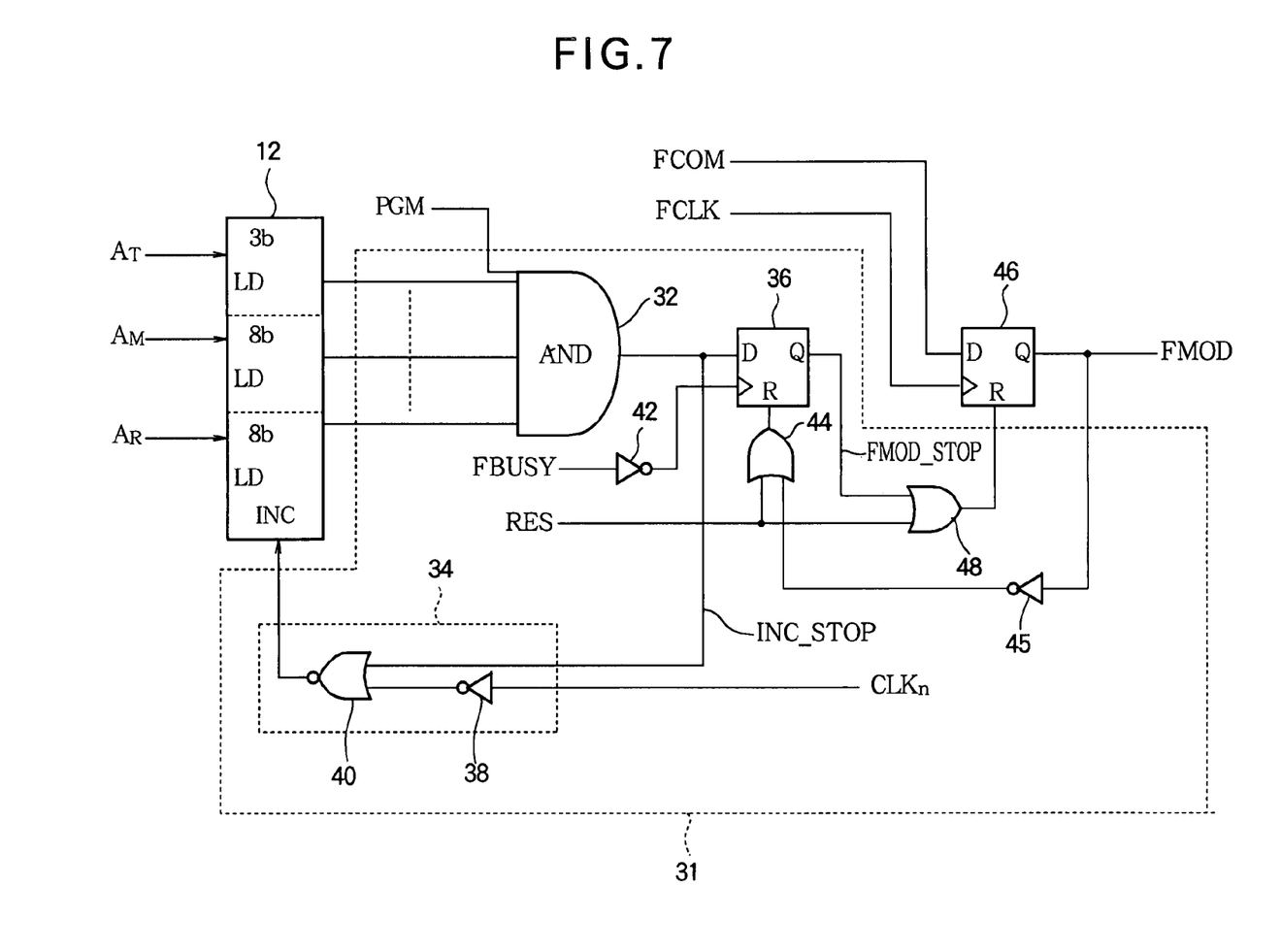
FIG. 7 is a circuit diagram showing part of a flash interface circuit according to a first embodiment of the invention.

FIG. 7 illustrates a first embodiment of the invention by showing the presettable address counter 12 and a novel resetting circuit or write terminating circuit 31 that is added to the conventional flash interface (FIG. 2) to halt write operations when the maximum address is reached.

The write terminating circuit 31 includes a clocked AND gate 32 that receives a program signal (PGM) and the nineteen bits of address data output from the presettable address counter 12. The program signal is driven low during the programming of data into the memory cell array in the flash memory 8, and is high at other times. The AND gate 32 responds to the address input when the program signal goes high, and holds its existing output state while the program signal is low. The output of the AND gate 32 is therefore normally low, remains low until the programming of the penultimate byte in the memory cell array is completed, and then goes high. This output signal is supplied as an increment stopping signal (INC_STOP) to a clock gating circuit 34 and a first resettable D-type flip-flop, also referred to below as an intermediate flip-flop 36. The output of the AND gate 32 is reset to the low level when the flash mode signal (FMOD) goes low.

The clock gating circuit 34 includes an inverter 38 that inverts the incrementing clock signal CLKn and a two-input NOR gate 40 that receives the inverted incrementing clock signal and the increment stopping signal (INC_STOP). The signal output from NOR gate 40 is identical to the incrementing clock signal (CLKn) when the increment stopping signal (INC_STOP) is low, and is held at the low logic level when the increment stopping signal (INC_STOP) is high. This output signal is supplied to the incrementing (INC) input terminal of the presettable address counter 12 as a gated clock signal.

The intermediate flip-flop 36 has a data (D) input terminal that receives the increment stopping signal (INC_STOP), a clock (>) input terminal that receives the output of an inverter 42, and a reset (R) input terminal that receives the output of an OR gate 44. Inverter 42 inverts the flash busy signal (FBUSY). OR gate 44 takes the logical OR of an active-high reset signal (RES) and an inverted flash mode signal output from an inverter 45 that inverts the flash mode signal (FMOD). The intermediate flip-flop 36 also has an output (Q) terminal from which a flash mode stopping signal (FMOD_STOP) is output.

The flash mode signal (FMOD) is output from another resettable D-type flip-flop, also referred to below as a status flip-flop 46, that receives a flash command signal (FCOM) at its data input terminal, a flash clock signal (FCLK) at its clock input terminal, and the output of another OR gate 48 at its reset input terminal. OR gate 48 takes the logical OR of the active-high reset signal (RES) and the flash mode stopping signal (FMOD_STOP). The FCOM and FCLK signals are generated by the flash interface to indicate that a write operation or other flash memory access operation is in progress and to synchronize the operation. The FCOM signal indicates that the flash interface has received a command for controlling the flash memory and that execution of the command has not yet been completed The operation of the write terminating circuit 31 is illustrated in FIG. 8, which shows a continuation of the write operation started in FIG. 5, replacing the incrementing clock (CLKn) waveform with the waveform of the gated clock signal input at the increment terminal (INC) of the presettable address counter 12, and additionally showing waveforms of the increment stopping signal (INC_STOP) and flash mode stopping signal (FMOD_STOP).

Figure 8:
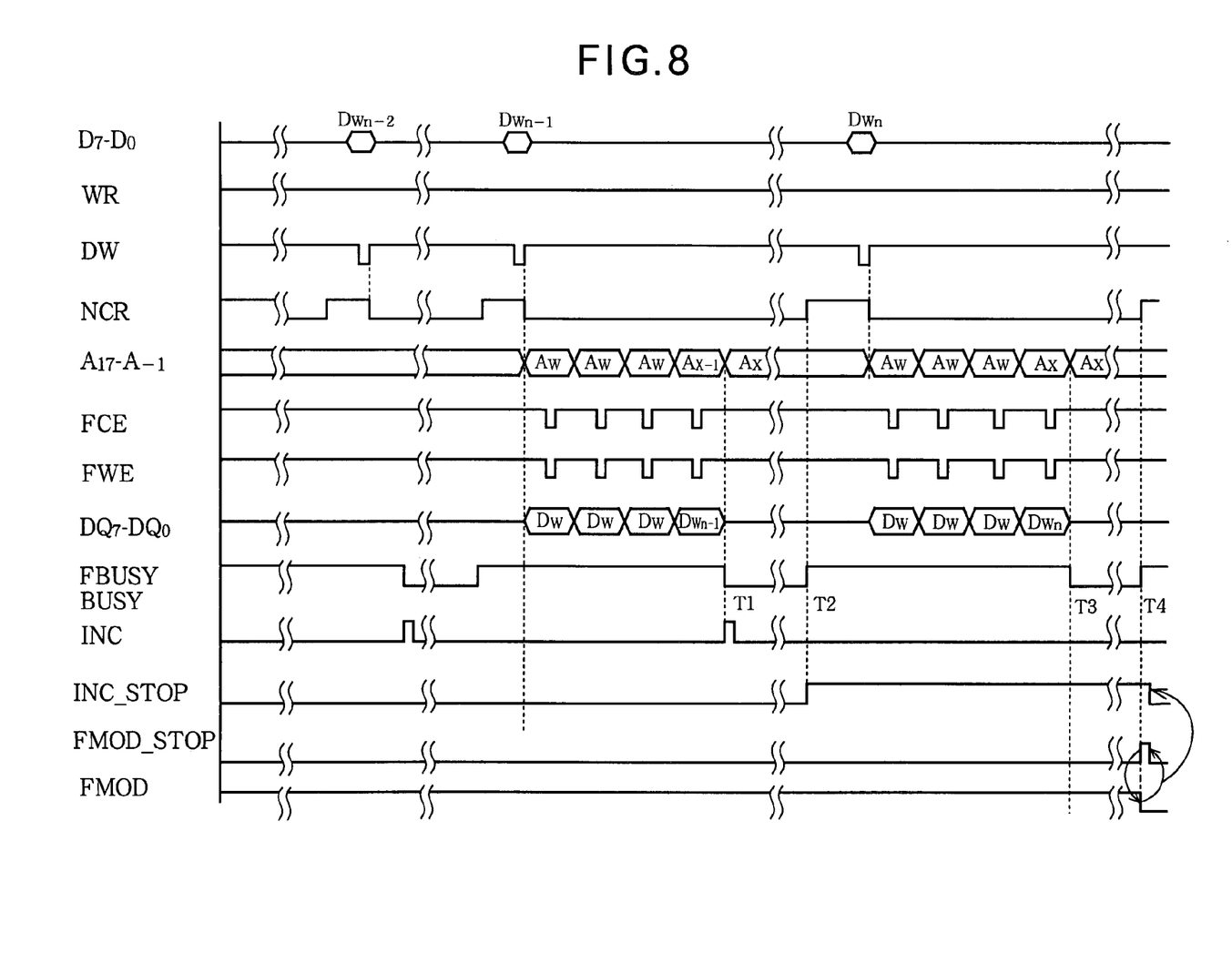
FIG. 8 is a timing waveform diagram illustrating the termination of a write operation in the first embodiment.

FIG. 8 illustrates the writing of data $D_{Wn-2}$, $D_{Wn-1}$, $D_{Wn}$ in the last three bytes of the flash memory cell array. The last byte $D_{Wn}$ is written at the maximum address $A_x$, at which all of the address bits are '1' ($A_x$='111 . . . 111'). The penultimate byte $D_{Wn-1}$ is written at the preceding address ($A_{x-1}$='111 . . . 110').

At time T1, when the busy signals (FBUSY, BUSY) go low to signify the start of the programming of the penultimate byte of data $D_{Wn-1}$, the control section 10 generates an incrementing clock pulse on the CLKn signal line. This pulse is transmitted through the clock gating circuit 34 to the increment (INC) terminal of the presettable address counter 12 and increments the output address from $A_{x-1}$ to $A_x$. When the busy signals go high at time T2 at the end of the programming operation, AND gate 32 recognizes the maximum address ($A_x$='111 . . . 111') and activates the increment stopping signal (INC_STOP). The increment stopping signal remains high during the programming of the last byte from time T3 to T4, so the presettable address counter 12 is not incremented at time T3 (the INC input remains low).

At time T4, the high increment stopping signal (INC_STOP) is latched in intermediate flip-flop 36, and the flash mode stopping signal (FMOD_STOP) goes high, resetting status flip-flop 46 through OR gate 48. The flash mode signal (FMOD) promptly goes low. The inverted flash mode signal output from inverter 45 goes high, resetting intermediate flip-flop 36 through OR gate 44, so the flash mode stopping signal (FMOD_STOP) is inactivated. The high-to-low transition of the flash mode signal (FMOD) also resets the presettable address counter 12, so the increment stopping signal (INC_STOP) goes low.

As shown in FIG. 8, the write terminating circuit 31 added to the flash interface in the first embodiment enables the flash interface to terminate a write operation when the programming of the maximum address is completed without the need to receive a special termination command or other signals from the central processing unit. The load on the CPU interface is reduced accordingly, and unintended overwriting of new data on existing data (overprogramming), which can occur in the prior art due to a CPU malfunction or an error in the control program executed by the CPU, is also prevented.

Second Embodiment

Figure 9:
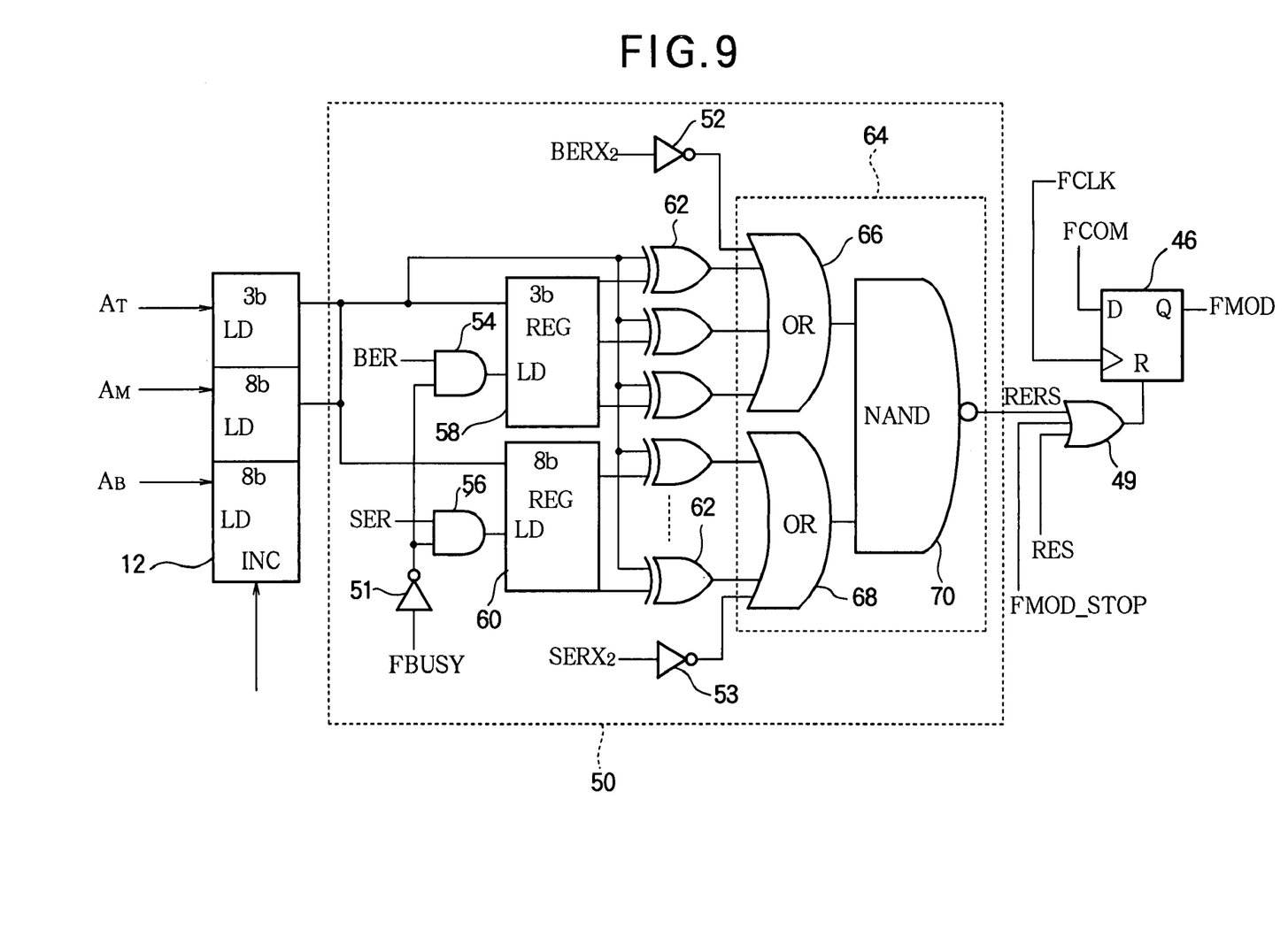
FIG. 9 is a circuit diagram showing part of a flash interface circuit according to a second embodiment of the invention.

Referring to FIG. 9, the second embodiment inserts a further resetting circuit, more specifically a consecutive erasing prevention circuit 50, between the presettable address counter 12 and the OR gate that resets the status flip-flop 46 that outputs the flash mode signal (FMOD) in the first embodiment. This OR gate 49 now has three inputs: the RE and FMOD_STOP signals described in the first embodiment, and a re-erase signal (RERS) output from the consecutive erasing prevention circuit 50.

In addition to the signals described above, the control section in the flash interface generates a block erase signal (BER) when it receives a block erase command code through the CPU interface 6 and a sector erase signal (SER) when it receives a sector erase command code. The control section keeps track of received erase commands, generates a consecutive block erase signal (BERX2) if it receives a block erase command code twice in succession, and generates a consecutive sector erase signal (SERX2) if it receives a sector erase command code twice in succession. These signals (BER, SER, BERX2, SERX2) are active high. The inputs to the consecutive erasing prevention circuit 50 include these signals (BER, SER, BERX2, SERX2), the flash busy signal (FBUSY), and the highest eight bits of address output from the presettable address counter 12. The consecutive erasing prevention circuit 50 includes inverters 51, 52, 53 that invert the FBUSY, BERX2, and SERX2 signals, respectively.

The consecutive erasing prevention circuit 50 also includes an AND gate 54 that receives the inverted flash busy signal and the block erase signal (BER), and an AND gate 56 that receives the inverted flash busy signal and the sector erase signal (SER). The output of AND gate 54 is supplied as a load signal to a three-bit register (3b REG) 58 that loads and stores the most significant three address bits ($A_{17}$, $A_{16}$, $A_{15}$) output from the presettable address counter 12: these three bits constitute a block address. The output of AND gate 56 is supplied as a load signal to an eight-bit register (8b REG) 60 that loads and stores the most significant eight address bits ($A_{17}$ to $A_{10}$) output from the presettable address counter 12: these eight bits constitute a sector address.

These eight address bits ($A_{17}$ to $A_{10}$) are also supplied to a set of eleven exclusive-OR gates 62. The first three exclusive-OR gates compare the most significant three address bits with the three bits latched in the three-bit register 58. The other eight exclusive-OR gates compare the most significant eight address bits with the eight bits latched in the eight-bit register 60. The output of each exclusive-OR gate is low when the two bits being compared match, and high when they do not. The outputs of the exclusive-OR gates 62 are supplied to a disabling circuit 64 including a pair of OR gates 66, 68 and a NAND gate 70.

OR gate 66 takes the logical OR of the inverted consecutive block erase signal output from inverter 52 and the comparison result signals output from the three exclusive-OR gates 62 that compare the block address currently output by the presettable address counter 12 with the block address stored in the three-bit register 58. The output of OR gate 66 is a first disabling signal that goes low (active) when two consecutive block erase command codes are received, both accompanied by the same block address. That is, the first disabling signal is activated when the flash interface is commanded to erase the same block twice consecutively. At other times, the first disabling signal is high.

OR gate 68 takes the logical OR of the inverted consecutive sector erase signal output from inverter 53 and the comparison result signals output from the eight exclusive-OR gates 62 that compare the sector address currently output by the presettable address counter 12 with the sector address stored in the eight-bit register 60. The output of OR gate 68 is a second disabling signal that goes low (active) when two consecutive sector erase command codes are received, both accompanied by the same sector address. That is, the second disabling signal is activated when the flash interface is commanded to erase the same sector twice consecutively. At other times, the second disabling signal is high.

The NAND gate 70 performs a logical NOT-AND operation on the outputs of the two OR gates 66, 68. The output of the NAND gate 70 is a third disabling signal that goes high (active) when the flash interface is commanded to erase the same block or sector twice consecutively, and is low (inactive) at other times. The output of the NAND gate 70 is supplied as the output of the consecutive erasing prevention circuit 50 to the OR gate 49 that resets status flip-flop 46.

Figure 10:
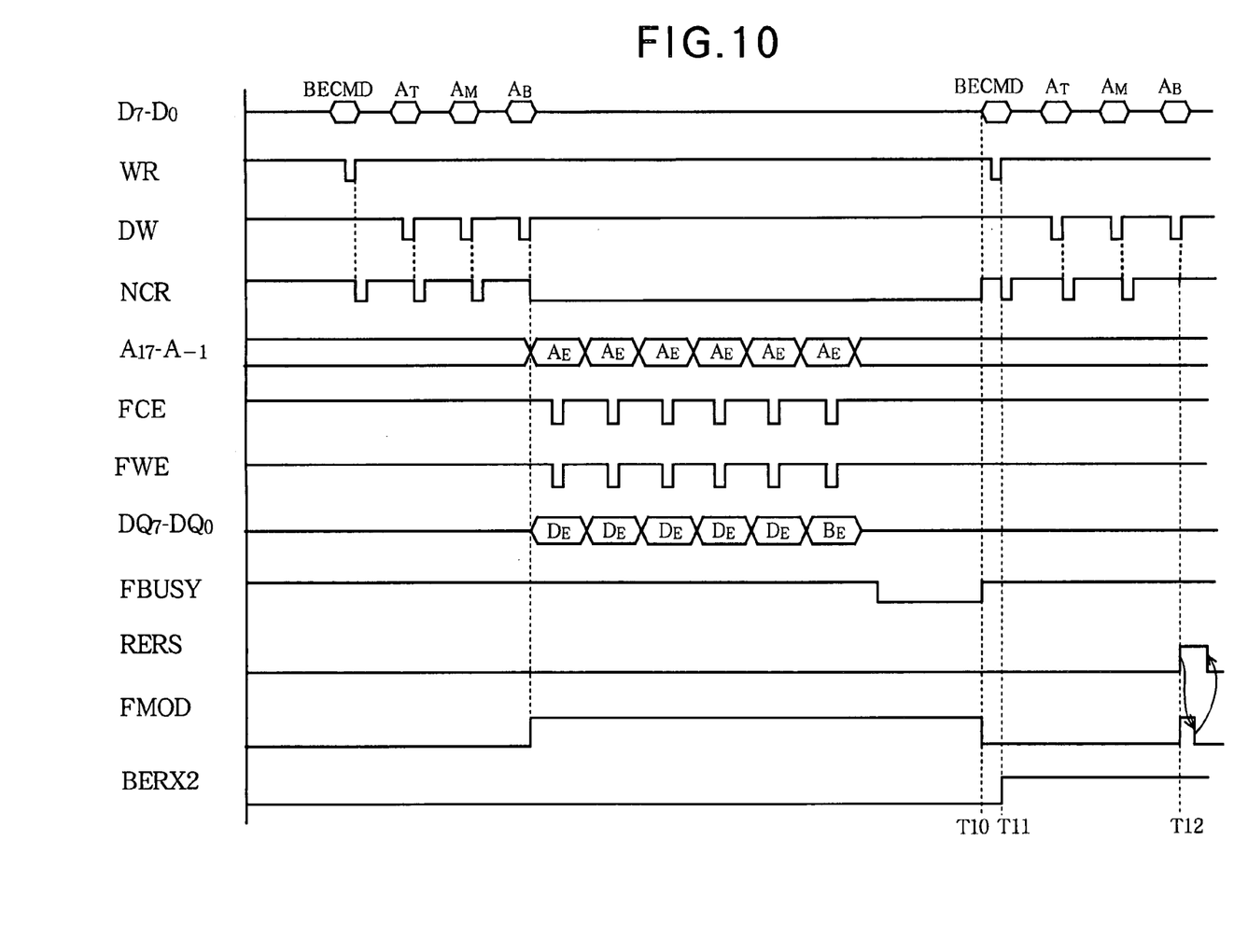
FIG. 10 is a timing waveform diagram illustrating block erase operations in the second embodiment.

FIG. 10 illustrates the operation of the second embodiment when two consecutive block erase command codes, both accompanied by the same block address, are received. The first command code (BECMD) is executed as described in FIG. 6, the flash busy signal (FBUSY) going low while the actual erasing operation is being performed, the flash mode signal (FMOD) going high during this interval and the preceding interval while the flash interface is transferring command code and address data to the flash memory. The high-to-low transition of the flash busy signal (FBUSY) loads the block address into the three-bit register 58 in the consecutive erasing prevention circuit 50. At the end of the erasing operation, at time T10, the flash busy signal (FBUSY) goes high and the flash mode signal (FMOD) goes low.

Next, at time T11, the flash interface receives another block erase command (BECMD), causing the consecutive block erase signal (BERX2) to go high. When reception of the following address information is completed at time T12, the flash mode signal (FMOD) again goes high, but before the flash busy signal (FBUSY) can go low, the exclusive-OR gates 62 in the consecutive erasing prevention circuit 50 compare the newly received block address output from the presettable address counter 12 with the previous block address stored in the three-bit register 58, find that the two addresses agree, and generate low output signals. The inverted BERX2 signal output from inverter 52 is also low, so all inputs to OR gate 66 are low, the first disabling signal output from OR gate 66 goes low, and the third disabling signal output from NAND gate 70 goes high, resetting the flash mode signal (FMOD) to the low logic level through OR gate 49 and status flip-flop 46. The low flash mode signal disables the second block erasing operation so that it does not take place.

The high-to-low transition of the flash mode signal (FMOD) also resets the re-erase signal (RERS) to the low logic level and the NCR signal to the high logic level, by circuitry not shown in the drawings. The BERSX2 signal remains high until a block erase operation with a different block address is carried out, or a write operation is carried out.

As illustrated in FIG. 10, the second embodiment prevents consecutive erasing of the same block. Consecutive erasing of the same sector is prevented by a similar sequence of operations, with the consecutive sector erase signal (SERX2) taking the place of the consecutive block erase signal (BERX2).

By preventing consecutive erasing of the same block or sector, the second embodiment prevents the most damaging type of over-erasing, thereby preventing rapid degradation of the memory cells in the flash memory.

The second embodiment can be practiced independently of the first embodiment. OR gate 49 need only receive the re-erase signal (RERS) output by the consecutive erasing prevention circuit 50, or only the RERS signal and the reset signal (RE), if the write termination circuit 31 described in the first embodiment is absent.

The logic circuitry in the first and second embodiments can be modified in numerous ways. For example, if the reset signal (RE) in FIG. 7 is active low, inverter 45 can be eliminated and OR gate 44 can be replaced by a NAND gate.

The invention is not restricted to use in a multi-chip package; it is generally applicable in any semiconductor integrated circuit having a flash interface.

Those skilled in the art will recognize that further variations are possible within the scope of the invention, which is defined in the appended claims.

What is claimed is:

1. A semiconductor integrated circuit having a flash interface for controlling a flash memory to perform read operations, write operations, and erase operations in the flash memory, the flash interface generating a status signal, setting the status signal to a first state while the flash interface is controlling the flash memory and to a second state while the flash interface is not controlling the flash memory, the flash interface including:
   an address circuit for input and output of flash memory addresses;
   a status circuit for generating the status signal; and
   a resetting circuit for resetting the status signal to the second state responsive to a flash memory address output from the address circuit, thereby halting control of the flash memory by the flash interface.

2. The semiconductor integrated circuit of claim 1, wherein the resetting circuit resets the status signal by sending a status resetting signal to the status circuit.

3. The semiconductor integrated circuit of claim 2, wherein the status circuit includes a resettable flip-flop having an output terminal from which the status signal is output and a reset terminal receiving the status resetting signal.

4. The semiconductor integrated circuit of claim 2, wherein the address circuit includes a counter that generates a consecutive series of said flash memory addresses.

5. The semiconductor integrated circuit of claim 4, wherein the resetting circuit includes:
   a first circuit for detecting output of a maximum address from the counter during a write operation in the flash memory and generating a signal that halts output of further consecutive addresses by the counter after the maximum address is detected during said write operation; and
   a second circuit for activating the status resetting signal after write access to the maximum address in the flash memory is completed.

6. The semiconductor integrated circuit of claim 5, wherein the first circuit includes:
   a first logic gate performing a logic operation on each address generated by the counter- to generate an increment stopping signal; and
   a second logic gate receiving a clock signal, performing a logic operation on the clock signal and the increment stopping signal to generate a gated clock signal, and supplying the gated clock signal to the counter;
   wherein the counter increments according to the gated clock signal.

7. The semiconductor integrated circuit of claim 6, wherein the second circuit includes:
   an intermediate flip-flip latching the increment stopping signal when the writing of data to each address in the flash memory is completed, thereby generating the status resetting signal.

8. The semiconductor integrated circuit of claim 7, wherein the intermediate flip-flop is a resettable flip-flop that is reset by the status signal.

9. The semiconductor integrated circuit of claim 1, wherein the flash memory has a memory cell array divided into a plurality of parts, said erase operations include erasing of a selectable one of the parts, and the resetting circuit includes:
   a consecutive erasing prevention circuit that resets the status signal to the second state when the flash interface circuit attempts to erase said one of the parts twice consecutively, thereby preventing consecutive erasing of said one of the parts.

10. The semiconductor integrated circuit of claim 9, wherein the consecutive erasing prevention circuit includes:
    a register storing an address output by the address circuit to designate said one of the parts; and
    a comparison circuit comparing the address output by the address circuit with the address already stored in the register to generate a disabling signal for resetting the status signal to the second state.

11. The semiconductor integrated circuit of claim 10, wherein the status circuit includes a resettable flip-flop having an output terminal from which the status signal is output and a reset terminal receiving the disabling signal.

12. The semiconductor integrated circuit of claim 9, wherein the plurality of parts include sectors and blocks, each block comprising a plurality of sectors, and the consecutive erasing prevention circuit includes:
    a first register storing an address of a block most recently erased by a block erase operation;
    a second register storing an address of a sector most recently erased by a sector erase operation;
    a first comparison circuit comparing an address output by the address circuit to designate one of the blocks with the address already stored in the first register when consecutive block erase operations are performed to generate a first disabling signal;
    a second comparison circuit comparing an address output by the address circuit to designate one of the sectors with the address already stored in the second register when consecutive sector erase operations are performed to generate a second disabling signal; and
    a logic gate combining the first disabling signal and the second disabling signal to generate a third disabling signal for resetting the status signal to the second state.

13. The semiconductor integrated circuit of claim 12, wherein the status circuit includes a resettable flip-flop having an output terminal from which the status signal is output and a reset terminal receiving the third disabling signal.

14. The semiconductor integrated circuit of claim 1, wherein the semiconductor integrated circuit and the flash memory are disposed in a multi-chip package.

15. A semiconductor integrated circuit having a flash interface for controlling a flash memory to perform read operations, write operations, and erase operations in the flash memory, the flash interface generating a status signal, setting the status signal to a first state while the flash interface is controlling the flash memory and to a second state while the flash interface is not controlling the flash memory, the flash interface also generating a flash command signal indicating that the flash interface has received a command for controlling the flash memory and that execution of the command has not yet been completed, a flash clock signal for synchronizing flash memory operations, a program signal activated during the writing of data into the flash memory, an incrementing clock signal, and a reset signal, the flash memory generating a flash busy signal indicating that the flash memory is executing a write operation or erase operation, the flash interface including:
   a counter receiving address information designating an address in the flash memory, incrementing the received address to generate a series of consecutive addresses, and successively outputting the received address and the consecutive addresses, each output address including a plurality of bits;
   a clocked AND gate taking a logical AND of all bits of each address output by the counter in synchronization with the program signal to generate a first stopping signal;
   a first inverter inverting the flash busy signal;
   a second inverter inverting the status signal;
   a third inverter inverting the incrementing clock signal;
   a first OR gate taking a logical OR of the reset signal and the inverted status signal to generate a first resetting signal;
   a first resettable flip-flop latching the first stopping signal in synchronization with the inverted flash busy signal to generate a second stopping signal, having a reset input terminal receiving the first resetting signal and an output terminal from which the second stopping signal is output;
   a second OR gate taking a logical OR of the reset signal and the second stopping signal to generate a second resetting signal;
   a second resettable flip-flop latching the flash command signal in synchronization with the flash clock signal to generate the status signal, having a reset input terminal receiving the second resetting signal and an output terminal from which the status signal is output; and
   a NOR gate taking a logical NOT-OR of the first stopping signal and the inverted incrementing clock signal to generate a gated clock signal;
   wherein the counter increments the received address according to the gated clock signal.

16. The semiconductor integrated circuit of claim 15, wherein the reset signal, the first resetting signal, and the second resetting signal are active high and the flash busy signal is active low.

17. A semiconductor integrated circuit having a flash interface for controlling a flash memory to perform read operations, write operations, and erase operations in the flash memory, the flash interface generating a status signal, setting the status signal to a first state while the flash interface is controlling the flash memory and to a second state while the flash interface is not controlling the flash memory, the flash memory having a memory cell array organized into a plurality of blocks, each block including a plurality of sectors, the blocks and sectors being individually erasable, the flash interface also generating a block erase signal indicating reception of a block erase command, a sector erase signal indicating reception of a sector erase command, a consecutive block erase signal indicating reception of consecutive block erase commands, a consecutive sector erase signal indicating reception of consecutive sector erase commands, a flash command signal indicating that the flash interface has received a command for controlling the flash memory and that execution of the command has not yet been completed, a flash clock signal for synchronizing flash memory operations, the flash memory generating a flash busy signal indicating that the flash memory is executing a write operation or erase operation, the flash interface including:
   a counter receiving address information designating an address in the flash memory, incrementing the received address to generate a series of consecutive addresses, and successively outputting the received address and the consecutive addresses, each output address including a plurality of bits;
   a first inverter inverting the flash busy signal;
   a second inverter inverting the consecutive block erase signal;
   a third inverter inverting the consecutive sector erase signal;
   a first AND gate taking a logical AND of the inverted flash busy signal and the block erase signal to generate a first load signal;
   a second AND gate taking a logical AND of the inverted flash busy signal and the sector erase signal to generate a second load signal;
   a first register storing a first group of bits output by the counter, designating a block address, in synchronization with the first load signal;
   a second register storing a second group of bits output by the counter, designating a sector address, in synchronization with the second load signal;
   a first plurality of exclusive-OR gates comparing the first group of bits with the block address already stored in the first register to generate respective comparison results;
   a second plurality of exclusive-OR gates comparing the second group of bits with the sector address already stored in the second register to generate respective comparison results;
   a first OR gate taking a logical OR of the inverted consecutive block erase signal and the comparison results output from the first plurality of exclusive-OR gates to generate a first disabling signal;
   a second OR gate taking a logical OR of the inverted consecutive erase signal and the comparison results output from the second plurality of exclusive-OR gates to generate a second disabling signal;
   a NAND gate taking a logical NOT-AND of the first disabling signal and the second disabling signal to generate a third disabling signal;
   a third OR gate taking a logical OR of the third disabling signal and the reset signal to generate a resetting signal; and
   a resettable flip-flop latching the flash command signal in synchronization with the flash clock signal to generate the status signal, having a reset input terminal receiving the resetting signal and an output terminal from which the status signal is output.

18. The semiconductor integrated circuit of claim 17, wherein the block erase signal, the sector erase signal, the consecutive block erase signal, the consecutive sector erase signal, the reset signal, and the resetting signal are active high and the flash busy signal is active low.

* * * * *